United States Patent
Ito et al.

(10) Patent No.: US 8,110,078 B2
(45) Date of Patent: Feb. 7, 2012

(54) SUBSTRATE SUPPORTING DEVICE AND SPUTTERING APPARATUS INCLUDING THE SAME

(75) Inventors: Kaoru Ito, Toyota (JP); Hirotoshi Matsui, Toyota (JP)

(73) Assignee: Kojima Press Industry Co., Ltd., Toyota-Shi (JP)

( * ) Notice: Subject to any disclaimer, the term of this patent is extended or adjusted under 35 U.S.C. 154(b) by 593 days.

(21) Appl. No.: 12/234,994

(22) Filed: Sep. 22, 2008

(65) Prior Publication Data

US 2009/0127109 A1    May 21, 2009

(30) Foreign Application Priority Data

Nov. 19, 2007 (JP) .................................. 2007-299268

(51) Int. Cl.
*C23C 14/34* (2006.01)

(52) U.S. Cl. ................................................. 204/298.15

(58) Field of Classification Search .................. 427/127, 427/250, 328; 118/730
See application file for complete search history.

(56) References Cited

U.S. PATENT DOCUMENTS 5,962,080 A * 10/1999 Tan et al. ...................... 427/529
6,086,727 A * 7/2000 Pinarbasi ................. 204/192.11

FOREIGN PATENT DOCUMENTS

| DE | 198 11 873 A1 | 9/1998 |
| DE | 19811873 A1 * | 9/1998 |
| EP | 0 962 547 A1 | 12/1999 |
| JP | 03-232963 A1 | 10/1991 |
| JP | 05-010464 U | 2/1993 |
| JP | 05-051740 A1 | 3/1993 |
| JP | 05-320892 A1 | 12/1993 |
| JP | 05-320893 A1 | 12/1993 |
| JP | 2009-108384 A1 | 5/2009 |

* cited by examiner

*Primary Examiner* — Keith Hendricks
*Assistant Examiner* — Jenny Wu
(74) *Attorney, Agent, or Firm* — Burr & Brown

(57) ABSTRACT

A substrate supporting device for forming a coating film having a maximally even and necessary thickness with a sufficiently strong adhesiveness and a good film quality on a substrate, and a sputtering apparatus including such a substrate supporting device. The substrate supporting device for supporting a substrate on which a coating film is formed by sputtering is disposed in a vacuum chamber so as to be opposed to a sputtering target. The substrate supporting device is rotatable around a first rotation axis by a first driving mechanism and is rotatable around a second rotation axis by a second driving mechanism.

8 Claims, 6 Drawing Sheets

SUBSTRATE SUPPORTING DEVICE AND SPUTTERING APPARATUS INCLUDING THE SAME

The present application is based on Japanese Patent Application No. 2007-299268 filed on Nov. 19, 2007, the contents of which are incorporated herein by reference.

BACKGROUND OF THE INVENTION

1. Field of the Invention

The present invention relates to a substrate supporting device and a sputtering apparatus. Described more particularly, the invention relates to a substrate supporting device which supports a substrate in such a way that the substrate is opposed to a sputtering target in a vacuum chamber to form a coating film on the substrate by sputtering, and to a sputtering apparatus including such a substrate supporting device provided in the vacuum chamber.

2. Description of the Related Art

There are conventionally known decorated products each provided with so-called metallic decoration that provides a metallic surface in appearance on a surface (a design surface) of a substrate comprised of a resin molded article or the like. Those decorated products, as alternatives to real metal products, have been broadly used, for example, as skin materials, parts, or the like of various products and items such as automobile interior parts, furniture, building materials, home electric appliances, and mobile electronic apparatuses.

Sputtering (a sputtering method) is conventionally known as one method for providing a metallic decoration on a substrate surface, which is performed when such decorated products are produced. As is well known, the sputtering method is performed as follows. Inside a vacuum chamber of a sputtering apparatus, a substrate is arranged so as to be opposed to a sputtering target made of a film deposition material with a predetermined distance therebetween. In that condition, high-energy particles such as inert gas ions are collided against the sputtering target to allow sputtered particles such as constituent atoms and ions of the target material to fly out (emitted) from the sputtering target. Then, the sputtered particles are adhered and deposited onto a surface of the substrate to form a coating film constituted by a metal film made of the same material as that of the sputtering target. According to the sputtering method, as compared to other decorating methods using metallic coating, metal plating, or the like, the coating film is formed on the substrate with an extremely small thickness and a sufficiently strong adhesiveness. Accordingly, the sputtering method can provide a decorated product with a high quality and a high durability.

The above sputtering method, in general, uses a sputtering apparatus in which a supporting device for supporting the substrate in a removable and positionally fixed manner is disposed inside a vacuum chamber. The substrate is supported by the supporting device disposed inside the vacuum chamber such that the substrate is opposed to a sputtering target in a manner so as to be spaced apart from each other by a predetermined distance, and then sputtering is performed.

When decoration is made on the substrate by the sputtering in the condition where the substrate is supported by the conventional supporting device as above, the sputtered particles ejected from the sputtering target and traveling in an opposing direction of the substrate and the sputtering target or in a direction intersecting diagonally with the opposing direction, regardless of the traveling directions of the sputtered particles, reach a surface of the substrate that is opposed to the sputtering target in a sufficient amount and surely adhere and deposit onto the surface thereof. Consequently, the coating film is formed with an even and sufficient thickness on the surface of the substrate that is opposed to the sputtering target.

However, in the above conventional method, the sputtered particles cannot be adhered on a surface of the substrate positioned opposite to the surface which is opposed to the sputtering target. Thus, it is impossible to form a coating film at once on both of the surfaces of the substrate, which is opposed to the sputtering target and the other surface thereof.

In addition, on side surfaces of the substrate positioned adjacently to the surface opposed to the sputtering target, particularly, among them, on a side surface orthogonal to the surface of the substrate opposed to the sputtering target, substantially, only a small part of the sputtered particles traveling in the direction intersecting diagonally to the opposing direction of the substrate and the sputtering target is adhered and deposited. Therefore, it is difficult to sufficiently secure the film thickness of the coating film formed on the side surfaces.

Furthermore, an incident angle of the sputtered particles to those side surfaces is extremely small. Thus, due to a so-called self-shadowing effect, the sputtered particles are deposited not in a layer form but in a columnar form. Accordingly, there occur defects such as an uneven thickness of the coating film and a reduction in adhesiveness of the coating film to the substrate. Moreover, if no undercoat layer is formed between the coating film and the substrate, when a topcoat layer is formed on a side opposite to a side of the substrate of the coating film, a component part contained in the topcoat layer (e.g. an organic solvent such as thinner) comes in contact with the substrate through minute holes or the like generated in a thinner part of the coating film. Thereby, there may be caused a risk of deterioration of a quality that may allow erosion of the substrate.

In JP-A-05-320893 and JP-A-05-51740, for example, there is proposed a technique in which a substrate is disposed in a vacuum chamber such that the substrate is supported rotatably around an axis, and along with a rotation around the axis, a portion of the substrate other than the surface thereof opposed to a sputtering target is positioned so as to be opposed at an angle with the sputtering target or parallel to the sputtering target. An expression of being "opposed at angle with the sputtering target or parallel to the sputtering target" means a condition in which a predetermined surface of the substrate is positioned so as to form an angle of from 0 degree to less than 90 degrees with respect to a surface of the sputtering target from which the sputtered particles are emitted. The expression is hereinafter used in the same meaning. In the above technique, however, the surface of the substrate that is allowed to be opposed at an angle or parallel to the sputtering target is limited to a certain surface. Thus, the technique does not allow all surfaces of the substrate to be opposed at an angle or parallel to the sputtering target. Accordingly, it is absolutely impossible to solve all the various problems described above.

SUMMARY OF THE INVENTION

The present invention has been made in the light of the situation described above. It is an object of the present invention to provide a substrate supporting device that supports a substrate in a vacuum chamber in order to perform sputtering, where the substrate can be supported in such a manner that entire surfaces of the substrate on which a coating film to be formed are opposed at an angle or parallel to a sputtering target. Thereby, by sputtering, a coating film having a maximally even and necessary thickness can be formed at once on the entire surfaces of the substrate on which the coating film to be formed, with a sufficiently strong adhesiveness and a good quality. It is another object of the present invention to provide a novel structure of a sputtering apparatus including the above substrate supporting device.

The above-indicated object of the invention may be attained according to a first aspect of the invention, which provides a substrate supporting device for supporting at least one substrate in a vacuum chamber so as to be opposed to a sputtering target made of a deposition material with a predetermined distance therebetween, thereby forming a coating film on the at least one substrate by sputtering, the device comprising: (a) at least one supporting member supporting the at least one substrate so as to be opposed to the sputtering target, the at least one supporting member being disposed in the vacuum chamber in a rotatable manner around a first rotation axis and a second rotation axis, the first rotation axis extending in a first direction orthogonal to a direction in which the at least one substrate and the sputtering target are opposed to each other and the second rotation axis extending in a second direction orthogonal to both of the first direction and the direction in which the at least one substrate and the sputtering target are opposed to each other, the at least one supporting member being each provided with the second rotation axes, (b) a first driving mechanism including a first driving unit generating a predetermined rotation driving force to rotationally drive the at least one supporting member around the first rotation axis; and (c) a second driving mechanism including a second driving unit generating a predetermined rotation driving force to rotationally drive the at least one supporting member around the second rotation axis.

The expressions of being "orthogonal to the opposing direction" and being "orthogonal to both of the opposing direction and the first direction" include angles slightly larger or slightly smaller than 90 degrees with respect to the opposing direction and the first direction. That is, the expressions mean being "substantially orthogonal to the opposing direction" and "substantially orthogonal to both of the opposing direction and the first direction", respectively. Hereinafter, those expressions are used in the same meanings as above. Further, the "rotation" includes not only a unidirectional rotation but also a reciprocating rotation and a reciprocating turn. Hereinafter, the "rotation" is used in the same meanings as above.

According to a preferable aspect of the present invention, the at least one supporting member comprises a plurality of supporting members, the plurality of supporting members being disposed adjacently and closely to each other in the first direction in the vacuum chamber and being opposed to the sputtering target, and wherein the plurality of supporting members adjacent to each other are rotated in mutually opposite directions around the respective second rotation axes by the second driving mechanism.

According to a preferable aspect of the present invention, the at least one supporting member comprises a plurality of supporting members, the plurality of supporting members being disposed adjacently and closely to each other in the second direction in the vacuum chamber and being opposed to the sputtering target, and wherein the plurality of supporting members adjacent to each other are rotated in mutually opposite directions around the first rotation axis by the first driving mechanism.

According to a preferable aspect of the present invention, the at least one supporting member is disposed in a rotatable manner around at least one of the first rotation axis and the second rotation axis in the vacuum chamber, and wherein the at least one supporting member is rotated continuously a plurality of times by at least one of the first driving mechanism and the second driving mechanism during the formation of the coating film on at least one surface of the at least one substrate supported by the at least one supporting member.

According to a preferable aspect of the present invention, the at least one supporting member is disposed in a rotatable manner around at least one of the first rotation axis and the second rotation axis in the vacuum chamber so as to be rotated by at least one of the first driving mechanism and the second driving mechanism, and wherein the substrate supporting device further comprises an adjustment mechanism to increase or reduce, i.e., to control, a rotation amount of the at least one supporting member to any desired amount.

According to a preferable aspect of the present invention, the at least one supporting member comprises a plurality of supporting members, the plurality of supporting members being disposed in a displaceable manner in the vacuum chamber, and wherein the substrate supporting device further comprises a position changing unit, the position changing unit being provided for changing positions of the plurality of supporting members such that each of the plurality of supporting members is located in turn at a position opposed to the sputtering target.

According to a preferable aspect of the present invention, the plurality of supporting members are disposed in a rotatable manner around a third rotation axis such that each of the plurality of supporting members is located in turn at the position opposed to the sputtering target in a horizontal direction along with the rotation, the third rotation axis extending in a vertical direction, and wherein the position changing unit comprises a third driving mechanism including a third driving unit generating a predetermined rotation driving force to rotationally drive the plurality of supporting members around the third rotation axis, and a controlling mechanism for controlling the rotational driving of the third driving unit such that the rotational driving of the third driving unit is suspended every time each of the plurality of supporting members is located in turn at the position opposed to the sputtering target along with the rotation of the plurality of supporting members.

According to a preferable aspect of the present invention, the first driving unit and the second driving unit comprise the same driving unit.

Further, the above-indicated another object of the present invention relating to the sputtering apparatus may be attained according to the present invention, which provides a sputtering apparatus including a sputtering target made of a deposition material and at least one substrate that are disposed in a vacuum chamber so as to be opposed to each other with a predetermined distance therebetween, the apparatus being used for forming a coating film made of the deposition material constituting the sputtering target on the at least one substrate by sputtering, wherein the substrate supporting device according to any one of the above substrate supporting device and the preferable aspects thereof is provided in the vacuum chamber to support the at least one substrate.

Thus, according to the substrate supporting device of the present invention, the substrate can be located in the vacuum chamber such that the substrate is opposed to the sputtering target with a predetermined distance therebetween while the substrate is supported by the supporting member.

Additionally, the first driving mechanism allows the supporting member to rotate around the first rotation axis, so that the substrate supported by the supporting member can be rotated around the first rotation axis. As a result, side surfaces of the substrate can be opposed to the sputtering target (namely, opposed at an angle or parallel thereto). The side surfaces include both the surfaces positioned in the second direction (a first side and a second side in the second direction) which is orthogonal to both of the first direction where the first rotation axis is extended and the opposing direction of the substrate and the sputtering target. Furthermore, when the substrate is rotated around the first rotation axis by 180 degrees from the position opposed to the sputtering target, a surface opposite to the surface of the substrate opposed to the sputtering target can also be opposed (opposed at angle or parallel) to the sputtering target.

Similarly, the second driving mechanism allows the supporting member to rotate around the second rotation axis, whereby the substrate supported by the supporting member can be rotated around the second rotation axis. As a result, side surfaces of the substrate positioned on the opposite sides in the first direction which is orthogonal to both of the second direction as the extending direction of the second rotation axis and the direction in which the substrate and the sputtering target are opposed to each other, can be opposed to the sputtering target (opposed at an angle or parallel thereto). Furthermore, the surface opposite to the surface of the substrate opposed to the sputtering target can also be opposed to the sputtering target (opposed at an angle or parallel thereto).

Accordingly, the substrate supporting device of the present invention allows the substrate to be supported in such a manner that entire surfaces of the substrate can be opposed at an angle or parallel to the sputtering target. Consequently, a coating film with a maximally even and necessary thickness is formed by sputtering with a sufficiently strong adhesiveness and a good film quality, at once and surely, on the entire surfaces of the substrate on which the coating film is to be formed.

In the sputtering apparatus according to the present invention, the substrate supporting device that exhibits the excellent characteristics as disclosed above is disposed in the vacuum chamber. Thus, the coating film with the maximally even and desired thickness can be formed at once with the sufficiently high adhesiveness and the good quality on the entire surfaces of the substrate on which the coating film is to be formed. This can provide a decorated product with a much higher quality and a more sufficient durability.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE INVENTION

To further clarify the present invention, there will be described a preferred embodiment of the invention by referring to the drawings.

Figure 1:
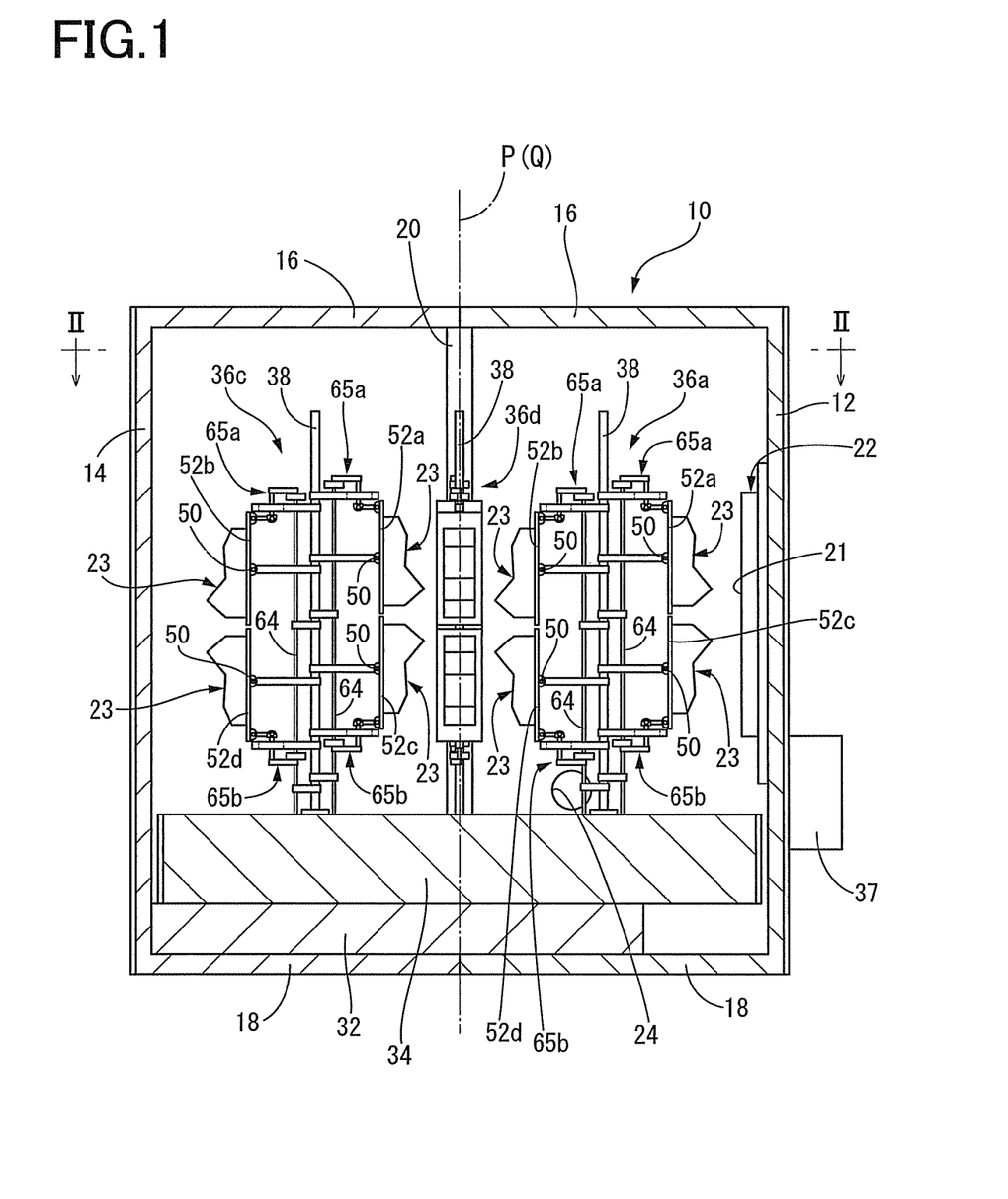
FIG. 1 is an elevational view in axial cross section taken along line I-I of FIG. 2 showing a sputtering apparatus having a structure according to an embodiment of the present invention.
Figure 2:
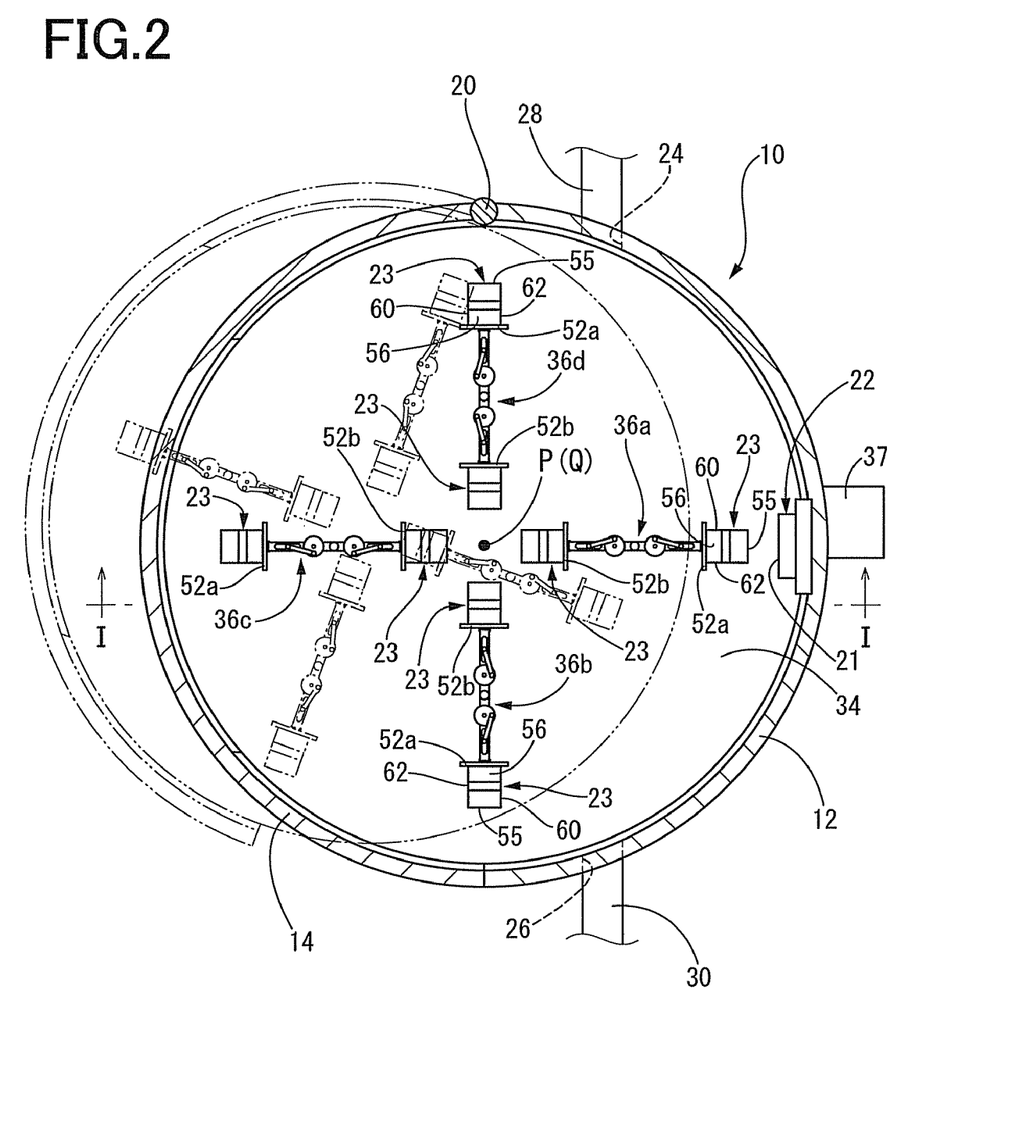
FIG. 2 is a cross sectional view taken along line II-II of FIG. 1.

Referring first to FIGS. 1 and 2, there is shown a longitudinal sectional view and a cross sectional view, respectively, schematically showing a sputtering apparatus constructed according to an embodiment of the present invention, in which the sputtering apparatus is used to form a coating film made of a metal thin film on a surface of an automobile interior part. As apparent from the drawings, the sputtering apparatus of the present embodiment includes a vacuum chamber 10.

The vacuum chamber 10 has a generally cylindrical box-like configuration having bottoms. Specifically, the vacuum chamber 10 includes a fixed tubular wall portion 12 and a movable tubular wall portion 14 each having a half-split cylindrical shape extending in a vertical direction. At upper ends and lower ends of the fixed tubular wall portion 12 and the movable tubular wall portion 14, upper bottom wall portions 16, 16 and lower bottom wall portions 18, 18 having a half-disk shape extending in a horizontal direction are integrally formed. Then, the fixed tubular wall portion 12 and the movable tubular wall portion 14 are connected to each other via a hinge 20. As shown by a two-dotted chain line and a solid line in FIG. 2, the vacuum chamber 10 is opened or tightly closed as the movable tubular wall portion 14 is rotated around the hinge 20 as a rotation center.

The vacuum chamber 10 is provided with a sputtering target 22 which is fixed at a center portion in a circumferential direction of a circumferential surface of the fixed tubular wall portion 12. The sputtering target 22 has a longitudinal rectangular plate-like shape and is positioned so as to be extended in a height direction (a vertical direction) of the fixed tubular wall portion 12. Additionally, an emission surface 21 of the sputtering target 22 is located so as to be directed toward a center axis P of the vacuum chamber 10 and so as to be orthogonal to a straight line (a vertical line with respect to the center axis P) extending in a radial direction (a horizontal direction) of the vacuum chamber 10. The emission surface 21 is comprised of a surface of the sputtering target 22 in a thickness direction thereof, and as will be described below, the emission surface 21 emits sputtered particles by irradiating high-energy particles thereon.

In the present invention, the sputtering target 22 is comprised of a material for a metal thin film to be formed on a surface of an automobile interior part 23 as a substrate. Specifically, for example, a metallic material such as aluminum, copper, nickel, or chrome may be used alone or an alloy material made of two or more kinds of metallic materials selected therefrom may be used to form the sputtering target 22. In addition, the sputtering target 22 may be made of stainless steel. The sputtering target 22 is connected to a power supply device that is used to apply a predetermined voltage to the target, although the device is not shown in the drawing.

A gas emission hole 24 is formed at a circumferential end portion of the fixed tubular wall portion 12, and a gas introduction hole 26 is formed at the other circumferential end portion of the fixed tubular wall portion 12. A gas emission pipe 28 is connected to the gas emission hole 24 at an end thereof and to a vacuum pump (not shown) at the other end thereof. A gas introduction pipe 30 is connected to the gas introduction hole 26 at an end thereof and to a gas supply device (not shown), which supplies a reaction gas such as an inert gas, at the other end thereof.

A base 32 is fixedly disposed at a lower end portion of the movable tubular wall portion 14. On the base 32 is provided a rotation stage 34. The rotation stage 34 has a circular shape and is rotated around a rotation axis Q of the rotation stage 34, by a cooperative operation of a known gear mechanism and an electric motor (not shown) disposed inside the base 32. The rotation axis Q is a third rotation axis extended in a vertical direction (upper and lower directions) and the same axis as the center axis P of the vacuum chamber 10.

On the rotation stage 34 formed as described above are disposed four supporting devices, namely, first to fourth supporting devices 36*a*, 36*b*, 36*c*, and 36*d* that are spaced apart from each other by an equal distance in a circumferential direction of the rotation stage 34. As will be described below, each of the first to fourth supporting devices 36*a* to 36*d* includes four supporting plates 52*a*, 52*b*, 52*c*, and 52*d* as the supporting members, each of which is arranged to be extended in the vertical direction, which is the same direction as the rotation axis Q of the rotation stage 34 extends. Each of the supporting plates 52*a* to 52*d* is comprised of a longitudinal rectangular plate that supports an automobile interior part 23.

In this manner, with a rotation of the rotation stage 34 around the rotation axis Q, the first to fourth supporting devices 36*a* to 36*d* are rotated (revolved) along a circular trajectory around the rotation axis Q, thereby changing a circumferential position of each of the supporting devices on the rotation stage 34. Consequently, each one of the first to fourth supporting devices 36*a* to 36*d* are located in turn between the rotation axis Q and the sputtering target 22 mounted on the fixed tubular wall portion 12. At the same time, due to the positional changes of the supporting devices 36*a* to 36*d* along with the rotation of the rotation stage 34, the supporting plates 52 provided on the supporting devices 36*a* to 36*d* are also rotated around the rotation axis Q of the rotation stage 34, whereby each of the supporting device 36*a* to 36*d* is opposed to the emission surface 21 of the sputtering target 22 in the horizontal direction in turn.

In the present embodiment, a rotational driving of the electric motor for rotating the rotation stage 34 is controlled by a controller 37 as a controlling mechanism or apparatus, which is disposed on an outer surface of the fixed tubular wall portion 12. Thereby, the first to fourth supporting devices 36*a* to 36*d* are each located between the rotation axis Q of the rotation stage 34 and the sputtering target 22 mounted on the fixed tubular wall portion 12 in turn from the first supporting device 36*a*. Each time the sputtering device 36*a* to 36*d* are each located in that position and opposed to the emission surface 21 of the sputtering target 22, the rotation of the rotation stage 34 is suspended for a predetermined time. As apparent from the above structure, in the present embodiment, a third driving unit is comprised of the electric motor (not shown) rotationally driving the rotation stage 34. In addition, a third driving mechanism or apparatus is comprised of the electric motor, the gear mechanism (not shown) transmitting a rotation driving force of the electric motor to the rotation stage 34, and the rotation stage 34. Furthermore, a position changing unit is comprised of the electric motor, the gear mechanism, the rotation stage 34, which are included in the third driving mechanism, and the controller 37. The term "mechanism" is used in the same meaning as the term "apparatus" herein. The term "mechanism" will be used in such meaning hereinafter.

In the sputtering apparatus according to the present embodiment, particularly, as described above, the first to fourth supporting devices 36*a* to 36*d* that support the automobile interior parts 23 and that are rotated around the rotation axis Q of the rotation stage 34 have a special structure that the conventional sputtering apparatuses do not have.

Figure 3:
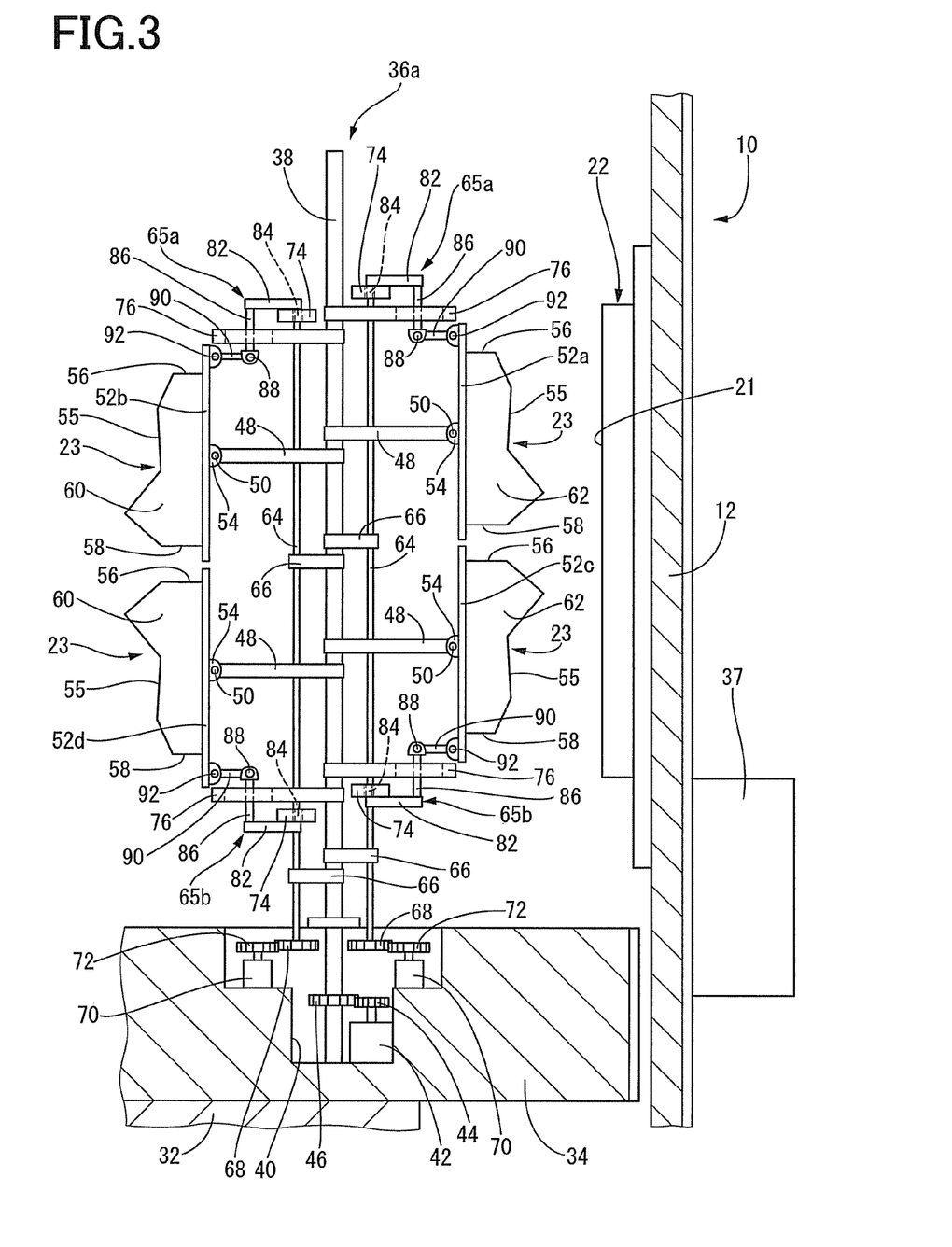
FIG. 3 is a partly enlarged view of FIG. 1.

Specifically, as shown in FIGS. 1 to 3, each of the first to fourth supporting devices 36*a* to 36*d* includes a first rotation axis 38 comprised of a relatively thick and longitudinally round bar. The first rotation axis 38 is extended in upper and lower directions, which is a first direction orthogonal to the horizontal direction in which the emission surface 21 of the sputtering target 22 is opposed to the supporting plates 52, namely, extended in an upper and lower directions in FIG. 3. Then, in that condition, the first rotation axis 38 is rotatably supported at an approximately center portion between the rotation axis Q of the rotation stage 34 and an outer peripheral edge of the rotation stage 34. In this case, the first rotation axes 38 of the first to fourth supporting devices 36*a* to 36*d* are disposed at an approximately center portion between the rotation axis Q of the rotation stage 34 and the outer peripheral edge of the rotation stage 34 such that they are spaced apart from each other in a circumferential direction by a predetermined distance. Thereby, the first to fourth supporting devices 36*a* to 36*d* are mutually spaced apart from each other by the equal distance in the circumferential direction of the rotation stage 34, as described above.

At a portion of the rotation stage 34 where the first rotation axis 38 of each of the supporting devices 36*a* to 36*d* is disposed, a stepped recess portion 40 is provided. The stepped recess portion 40 is open at an upper side thereof and has a stepped portion in which a diameter of the opening side is larger than that of a bottom side of the recess portion. A first driving gear 44 mounted on a driving axis of a first electric motor 42, which is disposed at the bottom of the stepped recess portion 40, is engaged with a first driven gear 46 fixed to a lower portion of the first rotation axis 38. Thereby, as the first electric motor 42 is driven, the first rotation axis 38 is rotationally driven. In this case, for example, the first electric motor 42 is comprised of a forwardly and reversely (reciprocatingly) rotatable stepping motor or the like, whereby the first rotation axis 38 is allowed to reciprocatingly rotate (forwardly and reversely rotate) along with the forward and reverse rotation of the first electric motor 42.

On the first rotation axis 38 of each of the supporting devices 36*a* to 36*d*, two retaining bars 48 are fixedly provided at two positions located upper and lower than a center portion by a predetermined length in the extending direction of the first rotation axis 38 (in the upper and lower directions in FIG. 3), namely, total of four retaining bars are provided. The four retaining bars 48 are extended by a predetermined length from the first rotation axis 38 in a horizontal direction orthogonal to the extending direction of the first rotation axis 38. At an extended tip portion of each of the four retaining bars 48 is provided a second rotation axis 50 extending in a horizontal direction (a direction vertical to a paper surface in FIG. 3), which is a second direction orthogonal to both of the extending direction of the first rotation axis 38 and the direction in which the emission surface 21 of the sputtering target 22 and the supporting plates 52 are opposed to each other.

Of the four retaining bars 48, at the respective extended tip portions of the two retaining bars 48, 48 located upper than the center portion of the first rotation axis 38, the upper supporting plates 52*a* and 52*b*, respectively, are mounted rotatably (turnably) around the second rotation axis 50 via a bracket 54 disposed on a first surface of each supporting plate in a thickness direction. Additionally, at the respective extended tip portions of the two retaining bars 48 located lower than the center portion of the first rotation axis 38, the lower supporting plates 52c and 52d, respectively, are mounted rotatably (turnably) around the second rotation axis 50 via the bracket 54.

In other words, on a first side of horizontally opposite sides having the first rotation axis 38 therebetween (namely, on a right side in FIG. 3), the upper supporting plate 52a and the lower supporting plate 52c are positioned closely adjacent to each other in the upper and lower directions in a rotatable manner around the second rotation axis 50. Meanwhile, on a second side of the horizontally opposite sides having the first rotation axis 38 therebetween (namely, on a left side in FIG. 3), the upper supporting plate 52b and the lower supporting plate 52d are positioned closely adjacent to each other in the upper and lower directions in a rotatable (turnable) manner around the second rotation axis 50.

In the upper and lower supporting plates 52a to 52d formed as described above, an engagement projection is integrally formed on a second surface of the each supporting plate opposite to the first surface where the bracket 54 is disposed, although the engagement projection is not shown in the drawing. The engagement projection, for example, has a claw portion, which is elastically deformable by a resin spring or the like. The automobile interior part 23, on which the metal thin film is to be formed, is engaged with the claw portion, whereby the automobile interior part 23 is removably supported by each of the supporting plates 52a to 52d.

In the embodiment, the automobile interior part 23 supported by each of the supporting plates 52a to 52d has a generally rectangular box-like configuration and an outer surface of a bottom portion thereof is referred to as a design surface 55. Additionally, side surfaces located on lower and upper sides of the design surface 55 are referred to as an upper side surface 56 and a lower side surface 58, respectively, as well as side surfaces located on left and right of the design surface 55 are referred to as a left side surface 60 and a right side surface 62, respectively. Accordingly, when each of the supporting plates 52a to 52d is located so as to be opposed to the sputtering target 22 by the rotation of the rotation stage 34 as described above, each of the automobile interior parts 23 is supported by each of the supporting plates 52 in such a manner that the design surface 55 is opposed to the emission surface 21 of the sputtering target 22 in the horizontal direction.

Thus, in each of the first to fourth supporting devices 36a to 36d, the four upper and lower supporting plates 52a to 52d are arranged such that two of the four supporting plates are disposed in the upper and lower directions on the opposite sides having the first rotation axis 38 therebetween in the horizontal direction, which is the same direction as the respective retaining bars 48 are extended. Additionally, the upper supporting plates 52a and 52b, respectively, and the lower supporting plates 52c and 52d, respectively, are mounted rotatably (turnably) around the second rotation axis 50 in such a manner that the first surfaces of the upper and lower supporting plates opposite to the second surfaces having the engagement projections are opposed to each other. All of the four supporting plates 52a to 52d mounted on the supporting devices 36a to 36d in the above manner are automatically and concurrently rotated around the first rotation axis 38 along with the rotation of the first rotation axis 38 driven by the first electric motor 42.

Thereby, in each of the first to fourth supporting devices 36a to 36d, the four automobile interior parts 23 are arranged such that each of the four interior parts 23 is supported by each of the upper and lower supporting plates 52a to 52d, and therefore, the interior parts 23 are arranged in the same pattern as in the upper and lower supporting plates 52a to 52d. Additionally, together with the supporting plates 52a to 52d, the four automobile interior parts 23 are automatically rotatable around the first rotation axis 38 and also rotatable around the second rotation axis 50. As apparent from the above structure, a first driving unit is constituted by the first electric motor 42 and a first driving mechanism is constituted by the first electric motor 42, the first driving gear 44, and the second driven gear 46. It should be understood that the structure shown in FIG. 2 is simplified by omitting all of the stepped recess portion 40, the first electric motor 42, the first driving gear 44, and the first driven gear 46.

In the present embodiment, a driving of the first electric motor 42 that automatically rotates the upper and lower supporting plates 52a to 52d of the supporting devices 36a to 36d around the first rotation axis 38 is controlled by the controller 37, which controls the driving of the electric motor, based on a driving condition of the electric motor rotationally driving the rotation stage 34.

Specifically, when any one of the first to fourth supporting devices 36a to 36d is located between the sputtering target 22 and the rotation axis Q of the rotation stage 34 and the rotation of the rotation stage 34 is suspended, a timer mechanism built in the controller 37 starts to time. Until the time reaches a predetermined time, the first electric motor 42 is continuously rotated forwardly and reversely (rotated reciprocatingly) a plurality of times by a predetermined rotation angle. Then, when the time reaches the predetermined time, the first electric motor 42 is half-turned in a single direction. Thereafter, until a time measured by the timer mechanism reaches the predetermined time, the first electric motor 42 is further continuously rotated forwardly and reversely a plurality of times by the predetermined rotation angle. Then, when the time reaches the predetermined time, the rotation is stopped. In this manner, the controller 37 controls the driving of the first electric motor 42. The controller 37 can also control a driving speed of the first electric motor 42 at the time of forward and reverse rotation, whereby a rotation rate of each of the supporting plates 52a to 52d rotating around the first rotation axis 38 is adjustable to a desired value.

In each of the first to fourth supporting devices 36a to 36d structured as described above, particularly, there is provided a rotation mechanism, which is a second driving mechanism, that automatically rotates each of the upper and lower supporting plates 52a to 52d, which is attached to each of the four retaining bars 48, around the second rotation axis 50. In the present embodiment, among the two upper supporting plates 52a, 52b and the two lower supporting plates 52c, 52d mounted on each of the supporting devices 36a to 36d, the upper supporting plate 52a and the lower supporting plate 52c arranged in the upper and lower positions on the first side of the horizontally opposite sides having the first rotation axis 38 therebetween (on the right side of FIG. 3) are rotated by a rotation mechanism, whereas the remaining upper supporting plate 52b and the remaining lower supporting plate 52d arranged in the upper and lower positions on the second side of the horizontally opposite sides having the first rotation axis 38 therebetween (on the left side of FIG. 3) are rotated by another rotation mechanism. The two rotation mechanisms have the same structure and are provided in each of the supporting devices 36a to 36d. Thus, hereinafter, only one of the two rotation mechanisms provided in the first supporting device 36a will be exemplified to describe the structure thereof in detail.

Of the two rotation mechanisms described above, the rotation mechanism that rotates each of the upper and lower supporting plates 52a and 52c located on the first side of the horizontal direction with respect to the first rotation axis 38 (on the right side of FIG. 3) includes a rotation mechanism axis 64 located between the first rotation axis 38 and the upper and lower supporting plates 52a, 52c, and two transmission mechanisms 65a, 65b transmitting a rotation driving force of the rotation mechanism axis 64 to the upper and lower supporting plates 52a and 52c.

More specifically, the rotation mechanism axis 64 is a round bar slimmer and shorter than the first rotation axis 38 and is located so as to be extended in parallel to the first rotation axis 38 in the vertical direction (the upper and lower directions). In that condition, the rotation mechanism axis 64 is rotatably supported by a plurality of supporting arms 66 (here, two supporting arms 66) that are unrotatably attached to the first rotation axis 38a at a middle position in a length direction of the first rotation axis 38, whereby the rotation mechanism axis 64 is rotatable independently from the first rotation axis 38. A lower end portion of the rotation mechanism axis 64 and a second driven gear 68 attached at the lower end portion thereof is positioned in the stepped recess portion 40 provided in the rotation stage 34. Then, the second driven gear 68 is engaged with a second driving gear 72 fixed to a driving axis of a second electric motor 70, which is a second driving unit, provided on a stepped portion of the stepped recess portion 40. Accordingly, the rotation mechanism axis 64 is rotationally driven by a driving of the second electric motor 70. In short, the rotation mechanism serving as the second driving mechanism includes the second electric motor 70, the second driving gear 72, and the second driven gear 68.

Figure 4:
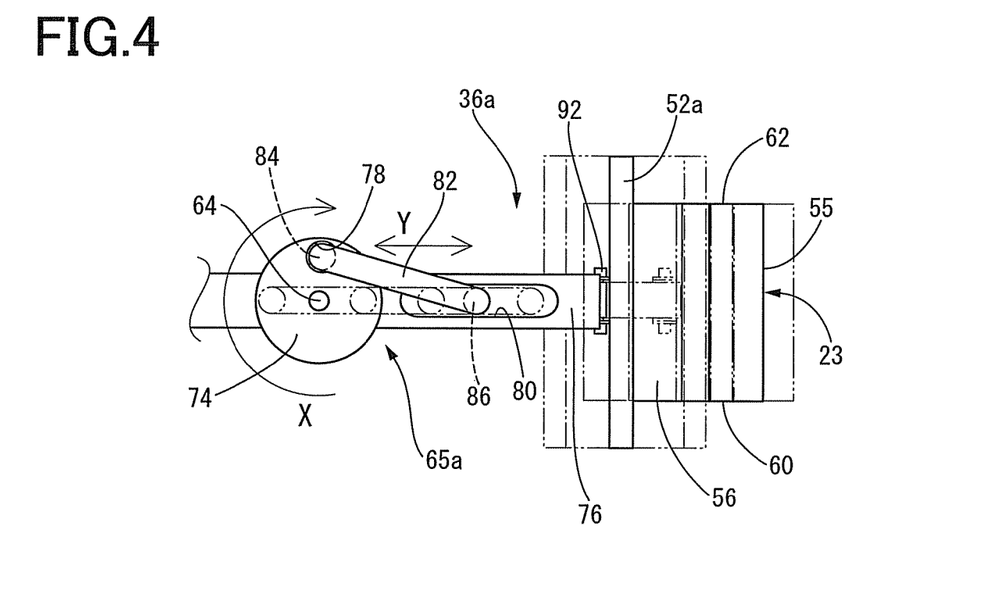
FIG. 4 is a partly enlarged view of FIG. 2.
Figure 5:
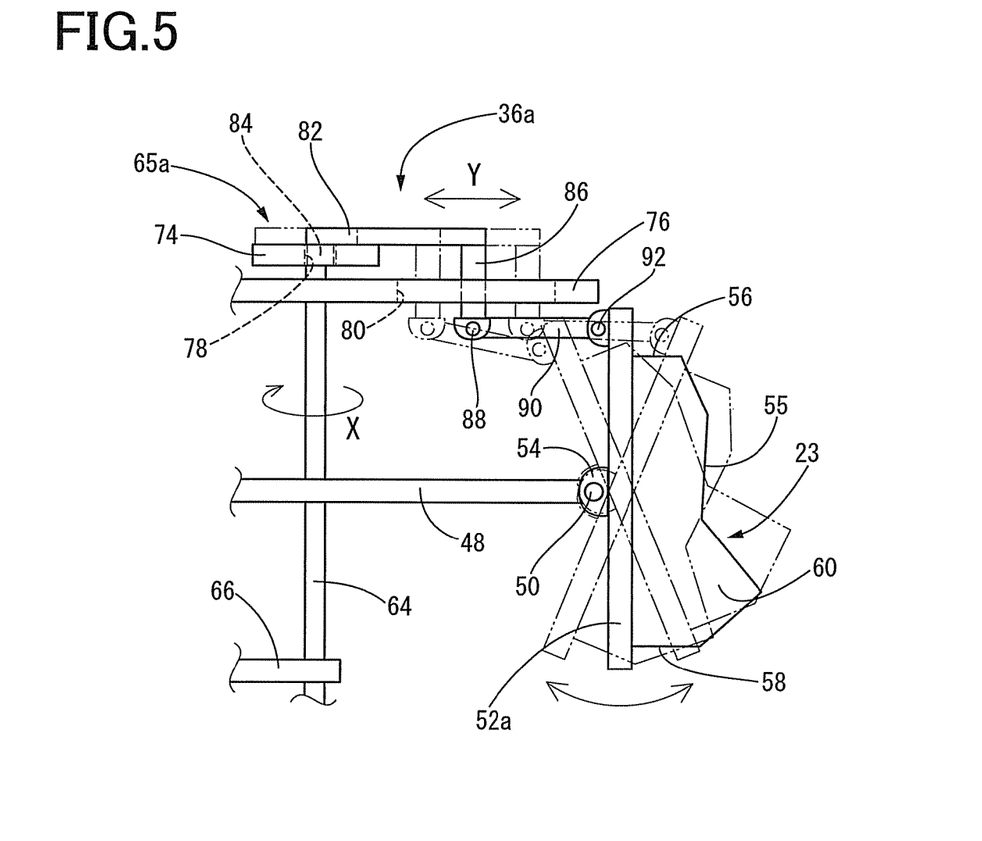
FIG. 5 is a partly enlarged view of FIG. 3.

Meanwhile, of the two transmission mechanisms 65a and 65b, the upper transmission mechanism 65a that transmits the rotation driving force to the upper supporting plate 52a includes a rotation plate 74 having a circular shape and a guide bar 76 that is made of a rectangular plate having a relatively large width and a relatively large thickness, as shown in FIGS. 3 to 5.

The circular rotation plate 74 of the upper transmission mechanism 65a is coaxially fixed to an upper end portion of the rotation mechanism axis 64 so as to be rotatable integrally with the rotation mechanism axis 64. At an outer peripheral portion of an upper surface of the rotation plate 74, there is provided a circular pinhole 78 penetrating the rotation plate 74.

Meanwhile, below the rotation plate 74, the guide bar 76 is extended in parallel to the retaining bar 48 with a length longer than a length of the rotation plate 74 toward the supporting plate 52a from the first rotation axis 38, but not so long as to reach the supporting plate 52a. Additionally, the guide bar 76 is attached unrotatably and fixedly at the first rotation axis 38. At a portion of the guide bar 76 extended beyond the rotation plate 74 toward a side opposite to a side of the first rotation axis 38, a long hole 80 that is extended in a length direction of the guide bar 76 is provided.

A first link 82 is provided so as to bridge the rotation plate 74 and the guide bar 76. The first link 82 has a thin planar shape and includes a crank pin 84 having a round-bar shape that is integrally formed at a first end portion in a length direction on a first side surface in a thickness direction of the first link 82. At a second end portion of the first link 82 is integrally formed a slide pin 86 having a round-bar shape longer than the crank pin 84. The crank pin 84 is slidably inserted into the pinhole 78 provided in the rotation plate 74 and the slide pin 86 is slidably inserted into the long hole 80 provided in the guide bar 76.

According to this arrangement, the rotation plate 74 and the guide bar 76 are connected to each other via the first link 82. Additionally, the crank pin 84 is displaced so as to describe a circular trajectory by a combined rotation of the rotation plate 74 and the rotation mechanism axis 64, whereby the slide pin 86 is slid along an inner circumferential surface of the long hole 80 and also is linearly reciprocated in a length direction of the long hole 80. In short, the rotation plate 74, the guide bar 76, and the first link 82 constitute a crank mechanism which converts a circular motion to a linear motion.

The slide pin 86 of the first link 82 formed as above penetrates through the long hole 80 of the guide bar 76, where a tip portion of the slide pin 86 is protruded by a predetermined length from a lower surface side of the guide bar 76. At the tip portion of the slide pin 86 is provided with a first turn axis 88 that is extended in parallel to the second rotation axis 50, and a second link 90 extended in parallel to the first link 82 is rotatably connected around the first turn axis 88 at a first end portion in a length direction of the second link 90. Additionally, a second end portion of the second link 90 is rotatably connected around a second turn axis 92 that is provided at an upper end portion of the surface of the supporting plate 52a having the retaining bar 48 thereon so as to extend in parallel to the second rotation axis 50.

Thus, with the rotation mechanism axis 64 rotated in a single direction (a clockwise direction indicated by an arrow X in each of FIGS. 4 and 5) by driving of the second electric motor 70, the rotation plate 74 is rotated in the same direction as the rotation direction of the rotation mechanism axis 64. Then, as shown by two-dotted chain lines in FIGS. 4 and 5, the rotation of the rotation plate 74 allow the slide pin 86 of the first link 82 and the second link 90 connected to the slide pin 86 to be reciprocatingly slid in an extending direction of the retaining bar 48, namely, in a direction where the emission surface 21 of the sputtering target 22 described above is opposed to the supporting plate 52a (in a direction indicated by an arrow Y in each of FIGS. 4 and 5).

Thereby, the rotation driving force of the rotation mechanism axis 64 is transmitted, via the upper transmission mechanism 65a, to the upper supporting plate 52a in a condition in which the rotation driving force has been converted into a reciprocatingly sliding motion in the above opposing direction of the sputtering target 22 and the supporting plate 52a. As a result, as shown by the two-dotted chain lines in FIGS. 4 and 5, the upper supporting plate 52a is structured so as to be automatically and reciprocatingly rotated around the second rotation axis 50.

The lower transmission mechanism 65b that transmits the rotation driving force of the rotation mechanism axis 64 to the lower supporting plate 52c includes the same constituent members as those of the upper transmission mechanism 65a described above. The constituent members of the lower transmission mechanism 65b are assembled to the supporting device 36a in such a manner that the constituent members are positioned upside down with respect to the constituent members of the upper transmission mechanism 65a.

Described more specifically, in the lower transmission mechanism 65b, the circular rotation plate 74 is integrally and rotatably fixed to the lower portion of the rotation mechanism axis 64, and the guide bar 76 is arranged above the rotation plate 74. Additionally, the crank pin 84 and the slide pin 86 of the first link 82 are slidably inserted into the pinhole 78 and the long hole 80, respectively, pierced in the rotation plate 74 and the guide bar 76, respectively. Thereby, the rotation plate 74 and the guide bar 76 are connected to each other by the first link 82. Furthermore, the second link 90 is connected to the tip portion of the slide pin 86 of the first link 82, which is entered into the long hole 80 and inserted therethrough, in a rotatable manner around the first turn axis 88 extended in parallel to the second rotation axis 50. The second link 90 is also connected to a lower end portion of the lower supporting plate 52*c* in a rotatable manner around the second turn axis 92 extended in parallel to the second rotation axis 50.

Thereby, the rotation driving force of the rotation mechanism axis 64 in the single direction (the clockwise direction indicated by the arrow X in FIGS. 4 and 5) by the driving of the second electric motor 70 is transmitted, via the lower transmission mechanism 65*b*, to the lower supporting plate 52*c* in the condition in which the rotation driving force has been converted into the reciprocatingly sliding motion in the opposing direction of the emission surface 21 of the sputtering target 22 and the supporting plate 52*a* (in the direction indicated by the arrow Y in each of FIGS. 4 and 5). As a result, along with the rotation of the rotation mechanism axis 64 in the single direction, the upper supporting plate 52*a* is reciprocatingly rotated around the second rotation axis 50, and also the lower supporting plate 52*c* is reciprocatingly rotated around the second rotation axis 50.

Although the rotation plate 74 of the lower transmission mechanism 65*b* is positioned upside down with respect to the rotation plate 74 of the upper transmission mechanism 65*a*, the pinholes 78, 78 provided in the rotation plates 74, 74 of both mechanisms are located at corresponding position in the vertical direction. In this manner, by the rotation of each of the rotation plates 74 of the upper and lower transmission mechanisms 65*a*, 65*b* along with a rotational driving of the rotation mechanism axis 64, the first links 82 and the second link 90 of the upper transmission mechanism 65*a*, respectively, is moved in unison with the first link 82 and the second link 90 of the lower transmission mechanism 65*b*.

Specifically, for example, when the first link 82 and the second link 90 of the upper transmission mechanism 65*a* are slid to a position most distant from the first rotation axis 38 by the rotational driving of the rotation mechanism axis 64, the first and second links 82 and 90 of the lower transmission mechanism 65*b* are also slid to the position most distant from the first rotation axis 38. Conversely, when the second link 90 of the upper transmission mechanism 65*a* is slid to a position nearest to the first rotation axis 38, the second link 90 of the lower transmission mechanism 65*b* is also slid to the position nearest to the first rotation axis 38.

Figure 6A:
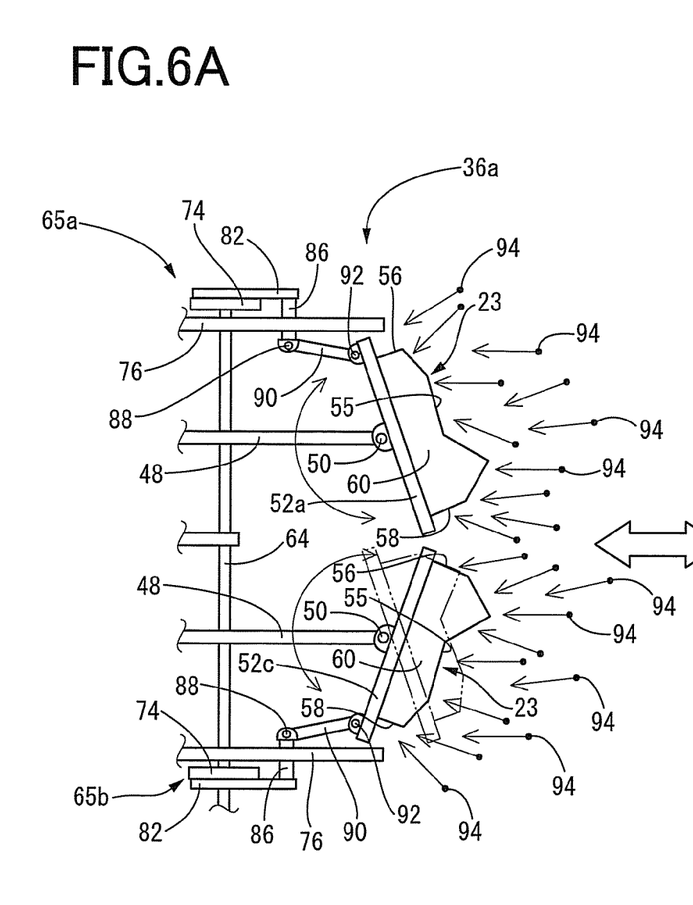
FIGS. 6A and 6B are partly enlarged views of FIG. 3 and show a rotation condition of supporting members.
Figure 6B:
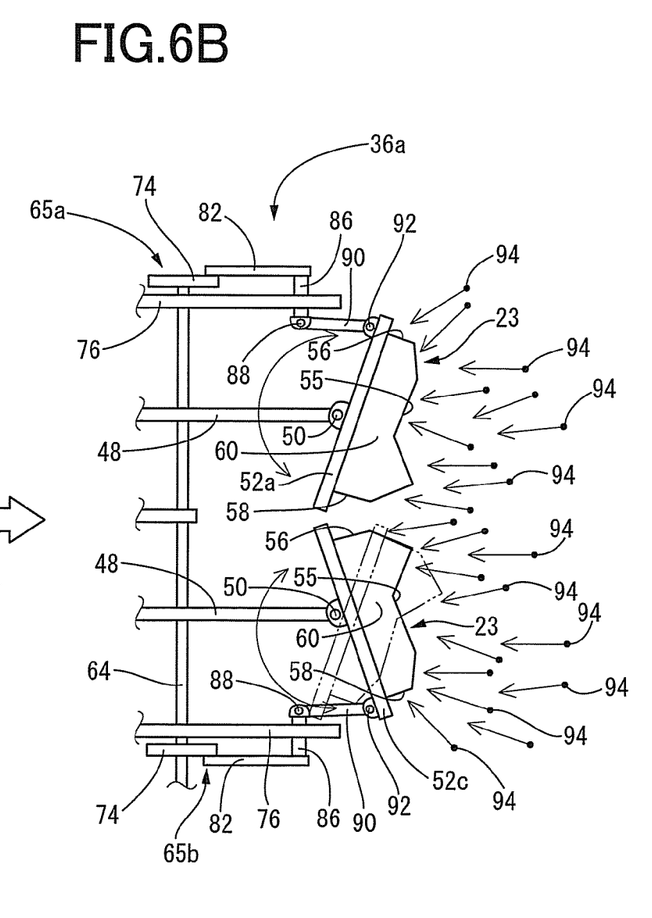

Consequently, by the rotational driving of the rotation mechanism axis 64, the upper and lower supporting plates 52*a* and 52*c* are reciprocatingly rotated in directions opposite to each other around the second rotation axis 50. For example, as shown in FIG. 6A, when the upper supporting plate 52*a* is rotated in a counter-clockwise direction, the lower supporting plate 52*c* is rotated in a clockwise direction. As shown in FIG. 6B, when the upper supporting plate 52*a* is rotated in the clockwise direction, the lower supporting plate 52*c* is rotated in the counter-clockwise direction.

In the present embodiment, furthermore, the driving of the second electric motor 70 rotationally driving the rotation mechanism axis 64 is controlled so as to be interlocked with suspension of the rotation of the rotation stage 34 by the controller 37, which controls the driving of the electric motor rotationally driving the rotation stage 34 and the driving of the first electric motor 42 rotationally driving the first rotation axis 38. That is, only during a time in which the rotation of the rotation stage 34 is suspended and the suspension condition continues, the second electric motor 70 that reciprocatingly rotates the upper and lower supporting plates 52*a* and 52*c* (52*b* and 52*d*) opposed to the sputtering target 22 is driven, whereby the upper and lower supporting plates 52*a* and 52*c* (52*b* and 52*d*) are continuously and reciprocatingly rotated a plurality of times. In other words, as will be described below, the upper and lower supporting plates 52*a* and 52*c* (52*b* and 52*d*) are continuously and reciprocatingly rotated the plurality of times from beginning to end of the formation of a coating film on each of the automobile interior parts 23 supported by the upper and lower supporting plates 52*a* and 52*c* (52*b* and 52*d*) opposed to the sputtering target 22. In addition, a driving rate of the second electric motor 70 can also be controlled by the controller 37, so that rotation rate of the upper and lower supporting plates 52*a* and 52*c* (52*b* and 52*d*) can be adjusted to desired values.

In addition to the rotation mechanism that has the structure described above and reciprocatingly rotate each of the upper and lower supporting plates 52*a* and 52*c* positioned on the first side in the horizontal direction with respect to the first rotation axis 38 (the right side in FIG. 3), the supporting device 36*a* includes another rotation mechanism that has the same constituent members as those of the above-described rotation mechanism and the constituent members are positioned in contrast on the opposite sides sandwiching the first rotation axis 38. Thereby, the upper and lower supporting plates 52*b* and 52*d* positioned on the second side of the horizontal direction with respect to the first rotation axis 38 (the left side in FIG. 3), respectively, are continuously and reciprocatingly rotated a plurality of times around the second rotation axis 50 by another rotation mechanism only during the time in which the suspension of the rotation of the rotation stage 34 is continued. Additionally, the remaining three supporting devices, namely the second to fourth supporting device 36*b* to 36*d*, also have the same structure as that of the first supporting device 36*a*.

In the formation of a metal thin film on the surface of the automobile interior parts 23 by the sputtering apparatus of the above present embodiment, for example, the following steps will be employed.

Initially, as indicated by the two-dotted chain line in FIG. 2, the vacuum chamber 10 is opened, and then, each one of the automobile interior parts 23 is engaged with the not-shown engagement projection and supported by the supporting plates 52*a* to 52*d*, where the four supporting plates 52*a* to 52*d* are provided on each of the first to fourth supporting devices 36*a* to 36*d*.

At this time, the design surfaces 55 of all the automobile interior parts 23 are directed toward a side opposite to a side where the first rotation axis 38 of the first to fourth supporting devices 36*a* to 36*d* is located. The first supporting device 36*a* is allowed to be positioned between the sputtering target 22 and the rotation axis Q of the rotation stage 34. The design surfaces 55 of only the two automobile interior parts 23 mounted on the upper and lower supporting plates 52*a* and 52*c* positioned on the first side in the horizontal direction in the first supporting device 36*a* are located so as to be opposed to the emission surface 21 of the sputtering target 22 in the vacuum chamber 10 (see FIG. 1). An operation for mounting the automobile interior parts 23 on the each of the supporting plates 52*a* to 52*d* is performed in the condition where the rotation of the rotation table 34 is suspended. Thus, although the rotation of the rotation table 34 is suspended as sputtering operation is yet to be started, driving of the first and second electric motors 42 and 70 are in the condition of being suspended by the controller 37.

Next, as shown by solid lines in FIGS. 1 and 2, the vacuum chamber 10 is tightly sealed, and in that condition, the not-shown vacuum pump is operated to discharge an air inside the vacuum chamber 10 to an outside thereof via the gas emission hole 24 and the gas emission pipe 28, whereby the inside of the vacuum chamber 10 is in a vacuumed condition having a predetermined vacuum level. After that, the not-shown gas supply device is operated to introduce a reaction gas composed of an inert gas such as argon gas, for example, to the inside of the vacuum chamber 10 via the gas introduction hole 26 and the gas introduction pipe 30.

After the reaction gas is filled in the vacuum chamber 10, a power supply device connected to the sputtering target 22 disposed inside the vacuum chamber 10 is operated to apply a predetermined voltage to the sputtering target 22. Thereby, plasma is generated ahead of the emission surface 21 of the sputtering target 22. This causes a sputtering phenomenon on the emission surface 21 of the sputtering target 22, whereby innumerable sputtered particles are emitted (knocked out) from the emission surface 21.

In this operation, simultaneously with the operation of the power supply device, namely, simultaneously with the start of the sputtering operation, the timer mechanism built in the controller 37 is started to time. Thereby, of the two second electric motors 70 provided in the first supporting device 36a, the second electric motor 70 that rotates the upper and lower supporting plates 52a and 52c located opposed to the sputtering target 22 is driven until a time measured by the timer mechanism reaches a predetermined time, so that the rotation mechanism axis 64 is rotated. Thereby, the upper and lower supporting plates 52a and 52c located opposed to the emission surface 21 of the sputtering target 22 are continuously and reciprocatingly rotated around the second rotation axis 50 a plurality of times. Then, at the same time with that, the first electric motor 42 rotating the first rotation axis 38 is also rotationally driven continuously by a predetermined rotation angle in both forward and backward directions until the time measured by the timer mechanism reaches the predetermined time, so that the first rotation axis 38 is rotated forwardly and reversely (rotate the axis reciprocatingly). Thereby, the upper and lower supporting plates 52a and 52c located opposed to the sputtering target 22 are continuously and reciprocatingly rotated around the first rotation axis 38 a plurality of times.

Along with the upper and lower supporting plates 52a and 52c, the two automobile interior parts 23 supported by the supporting plates 52a and 52c are also continuously and reciprocatingly rotated around the first rotation axis 38 and around the second rotation axis 50 simultaneously a plurality of times during a time from beginning of the operation of the power supply device to a predetermined time. In this manner, under the suspension of the rotation of each of the supporting plates 52a and 52c, in addition to the design surface 55 of each automobile interior part 23, the left and right side surfaces 60 and 62, and the upper and lower side surfaces 56 and 58 of the automobile interior part 23, which are arranged to be orthogonal to the emission surface 21 of the sputtering target 22, are allowed to be intermittently and continuously opposed to the emission surface 21 of the sputtering target 22 at an angle by the reciprocating rotations around the first and second rotation axes 38 and 50 during the time from beginning of the operation of the power supply device to the predetermined time.

In this operation, among innumerable sputtered particles 94 emitted (knocked out) from the sputtering target 22, the particles 94 traveling in directions obliquely intersecting with opposing directions of the side surfaces 56 to 62 and the emission surface 21 of the sputtering target 22 and also the particles 94 traveling in the opposing directions thereof are allowed to evenly and surely adhere and deposit not only on the design surface 55 but also on the upper and lower side surfaces 56, 58, and the left and right side surfaces 60, 62 of each of the two automobile interior parts 23 supported by the upper and lower supporting plates 52a and 52c. Additionally, the reciprocating rotation of each of the automobile interior parts 23 allows the side surfaces 56 to 62 to be inclined and opposed to the emission surface 21 of the sputtering target 22. Thus, as compared to the case in which the side surfaces 56 to 62 are located orthogonal to the emission surface 21 of the sputtering target 22, an incident angle of the sputtered particles 94 to the side surfaces 56 to 62 is sufficiently made large and thereby self-shadowing effect is suppressed, so that the sputtered particles 94 adhering onto the side surfaces 56 to 62 are deposited not in a columnar but in a layer form. In this manner, a coating film formed of a metal thin film, which is made of the same material as that of the sputtering target 22, is entirely formed on each of the design surface 55, the upper and lower side surfaces 56, 58, and the left and right side surfaces 60, 62 of the each automobile interior part 23.

Particularly, as shown in FIGS. 6A and 6B, the two automobile interior parts 23 supported by the upper supporting plate 52a and the lower supporting plate 52c, respectively, are reciprocatingly and simultaneously rotated in mutually opposite directions. This structure effectively prevents a problem of self-shadowing effect, which will be described below. If the two automobile interior parts 23 are reciprocatingly and simultaneously rotated in the same direction, the automobile interior part 23 supported by the upper supporting plate 52a reaches a rotation position indicated by a solid line in each of FIGS. 6A and 6B, and the automobile interior part 23 supported by the lower supporting plate 52c reaches the rotation position indicated by a two-dotted chain line in FIGS. 6A and 6B. In this case, during the rotations of the two automobile interior parts 23, there is caused a self-shadowing effect in which the upper side surface 56 of the automobile interior part 23 supported by the lower supporting plate 52c (the lower side surface 58 of the automobile interior part 23 supported by the upper supporting plate 52a) is hid behind the lower end portion of the upper supporting plate 52a (the upper end portion of the lower supporting plate 52c). Thereby, the adhesion of the sputtered particles 94 onto the upper side surface 56 (the lower side surface 58) is inhibited by the lower end portion of the upper supporting plate 52a (the upper end portion of the lower supporting plate 52c).

When the time measured by the timer mechanism built in the controller 37 reaches the predetermined time after the operation of the power supply device is started, the reciprocating rotations of the upper and lower supporting plates 52a and 52c and the reciprocating rotation of the first rotation axis 38 are automatically suspended at the rotation position shown in FIG. 3, and at the same time, the first rotation axis 38 is half-rotated. Thereby, the upper and lower supporting plates 52a and 52c supporting the two automobile interior parts 23 each having the coating film formed thereon change positions with the other upper and lower supporting plates 52b and 52d, whereby the respective design surfaces 55 of the two automobile interior parts 23 each having no coating film yet thereon are located opposed to the emission surface 21 of the sputtering target 22.

After that, the timer mechanism of the controller 37 resumes timing, so that the upper and lower supporting plates 52b, 52d and the first rotation axis 38 are automatically reciprocatingly and continuously turned or rotated, as the upper and lower supporting plates 52a, 52c and the first rotation axis 38 are turned and rotated before the half rotation of the first rotation axis 38. Then, such turns and the rotations are maintained to be continuously repeated a plurality of times until the time measured by the timer mechanism of the controller 37 reaches the predetermined time. As a result, the coating film as the metal thin film is also formed with a maximally even thickness on the entire surfaces of the automobile interior parts 23 supported by the upper and lower supporting plates 52b and 52d.

Then, when the time measured by the timer mechanism of the controller 37 reaches the predetermined time after the half rotation of the first rotation axis 38, the reciprocating turns and the reciprocating rotations of the upper and lower supporting plates 52b, 52d and the first rotation axis 38 are suspended.

Following that, the rotation stage 34 is rotated, and when the second supporting device 36b, instead of the first supporting device 36a, is located between the sputtering target 22 and the rotation axis Q of the rotation stage 34, the rotation of the rotation stage 34 is suspended. After that, the same operation as above is performed to form the coating film made of the metal thin film on the entire surfaces of the automobile interior part 23 supported by each of the four supporting plates 52a to 52d of the second supporting device 36b. Thereafter, in a condition where the third supporting device 36c and the fourth supporting device 36d are each located in turn between the sputtering target 22 and the rotation axis Q of the rotation stage 34, the same operation as above is performed to form the coating film made of the metal thin film on the entire surfaces of each of the automobile interior parts 23 supported by the supporting plates 52a to 52d of the third and fourth supporting devices 36c and 36d.

As described above, the sputtering apparatus according to the present embodiment enables many more sputtered particles 94 to be deposited in the layer form on all the design surfaces 55, the upper and lower side surfaces 56, 58 and the left and right side surfaces 60, 62 of all of the automobile interior parts 23 supported by the supporting plates 52 provided on each of the first to fourth supporting devices 36a to 36d. Accordingly, the intended coating film can be simultaneously formed on the entire surfaces of the automobile interior parts 23 where the coating film is to be formed, in a manner so as to have a maximally even and necessary thickness, as well as a sufficiently strong adhesiveness.

In addition, by using the sputtering apparatus according to the present embodiment, the coating film on the surfaces of the automobile interior parts 23 is formed with the even thickness due to deposition of the large number of sputtered particles 94 in the layer form. Thus, for example, when a topcoat layer is formed on a side of the coating film opposite to a side of the coating film facing the automobile interior parts 23, even if no undercoat layer is formed between the coating film and the surfaces of the automobile interior parts 23, it can be prevented that a component part contained in the topcoat layer contacts with the surfaces of the automobile interior parts 23 via minute holes or the like generated in thinner parts of the coating film and causes erosion of the surfaces. This can advantageously improve a quality of the coating film formed on the surfaces of the automobile interior parts 23.

Furthermore, in the sputtering apparatus above, the upper supporting plates 52a, 52b and the lower supporting plates 52c, 52b of the supporting devices 36a to 36d are simultaneously and reciprocatingly rotated in the mutually opposite directions. Thereby, it can be effectively prevented that the adhesion of the sputtered particles 94 onto the upper side surface 56 (the lower side surface 58) of each of the automobile interior parts 23 supported by the lower supporting plates 52c and 52d (the upper supporting plates 52a and 52b) is interfered by the lower end portion of the upper supporting plate 52a (the upper end portion of the lower supporting plate 52c). This can more surely prevent an occurrence of variation in the thickness of the coating film formed on the design surface 55 and the side surfaces 56 to 62 of each of the automobile interior parts 23 supported by the upper supporting plates 52a, 52b and the lower supporting plates 52c, 52d.

Furthermore, in the present embodiment, during the time from beginning to end of the formation of the coating film on the surfaces of the automobile interior parts 23 by the sputtering operation, along with the reciprocating rotation of each of the supporting plates 52a to 52d, each of the automobile interior parts 23 is continuously reciprocatingly rotated a plurality of times. Therefore, for example, unlike when each of the supporting plates 52a to 52d is rotated only one time during the time from beginning to end of the formation of the coating film, not only the sputtered particles 94 traveling to the side surfaces 56 to 62 among the surfaces of the automobile interior part 23 but also the sputtered particles 94 floating in an air around the automobile interior part 23 are efficiently and actively adhered to the surfaces 56 to 62. Thereby, the thickness of the coating film formed on each of the side surfaces 56 to 62 can be further equalized, and moreover, the each thickness thereof can be made maximally equal to the thickness of the coating film formed on the design surface 55 located opposed to the emission surface 21 of the sputtering target 22.

In the present embodiment, based on the driving control of the second electric motor 70 by the controller 37, the rotation rate of each of the supporting plates 52a to 52d can be controlled to the desired ratio. Accordingly, for example, increasing the rotation rate of each of the supporting plates 52a to 52d leads to an increase in an amount of the sputtered particles 94 adhering to the side surfaces 56 to 62, whereas reducing the rotation rate of the supporting plates 52a to 52d leads to a suppression of the amount of the sputtered particles 94 adhering to the respective side surfaces 56 to 62. In this way, the amount of the sputtered particles 94 adhering to the respective side surfaces 56 to 62 can be adjusted to the desired amount by adjusting the rotation rate of the supporting plates 52a to 52d. Thereby, regardless of areas of the side surfaces 56 to 62 of the automobile interior part 23, the coating film on the side surfaces 56 to 62 can be formed with a maximally sufficient and even thickness.

In the present embodiment, the second electric motor 70 that reciprocatingly rotates the upper and lower supporting plates 52a, 52c on the first side of each of the respective supporting devices 36a to 36d is provided independently from the second electric motor 70 that reciprocatingly rotates the upper and lower supporting plates 52b, 52d on the second side each thereof. Thereby, the reciprocating rotations of the upper and lower supporting plates 52a, 52c on the first side are performed independently from the reciprocating rotations of the upper and lower supporting plates 52b, 52d on the second side. Accordingly, among the four supporting plates 52a to 52d, only the supporting plate 52 supporting the automobile interior part 23 located opposed to the emission surface 21 of the sputtering target 22 can be selectively reciprocatingly rotated. This can advantageously reduce a cost of the operation for forming the coating film.

In the present embodiment, the second electric motors 70 rotating the respective supporting plates 52a to 52d and the first electric motor 42 rotating the first rotation axis 38 are comprised of a mutually independent motor. Therefore, for example, unlike when the first electric motor 42 and the second electric motors 70 are comprised of the same single motor, a mechanism for reciprocatingly rotating the respective supporting plates 52a to 52d can be formed independently from a mechanism for reciprocatingly rotating the first rotation axis 38. Thus, those mechanisms can have a relatively simplified structure.

In the sputtering apparatus of the present embodiment, the rotation stage 34 is rotated under the control of the controller 37, whereby the upper and lower supporting plates 52a and 52c (52b and 52d) provided in each of the first to fourth supporting devices 36a to 36d are located in turn at a position opposed to the emission surface 21 of the sputtering target 22. This enables a sequential and efficient operation for forming the coating film on the surfaces of the large number of automobile interior parts 23.

Hereinafter, comparative tests conducted by the present inventors will be described in detail in order to confirm that the sputtering apparatus having the structure according to the present invention can surely exhibit the excellent characteristics described above.

Initially, as shown in FIGS. 1 and 2, the sputtering apparatus was produced and prepared that has a structure in which the supporting plates 52 provided on the four supporting devices, namely, the first to fourth supporting devices 36a to 36d, can be reciprocatingly rotated around the second rotation axis 50.

Then, as shown in FIG. 3, each single automobile interior part 23 was supported by each of the upper and lower supporting plates 52a and 52c of the first supporting device 36a. Additionally, the design surfaces 55 of the two automobile interior parts 23 were located opposed to the emission surface 21 of the sputtering target 22.

Next, as shown in FIGS. 6A and 6B, along with the supporting plates 52a and 52c, each of the automobile interior parts 23 were reciprocatingly rotated around the second rotation axis 50 in opposite directions. Then, under such a condition, a predetermined voltage was applied to the sputtering target 22 by the power supply device (not shown) connected to the sputtering target to perform a sputtering operation so as to form a coating film on the design surface 55, the upper and lower side surfaces 56, 58, and the left and right side surfaces 60, 62. In this case, a rotation angle of each of the supporting plates 52a and 52c with respect to a vertical surface was set to ±30 degrees, and the rotation rate of each of the supporting plates 52a and 52b was set to 60 (reciprocation) times per minute. Furthermore, the sputtering operation was conducted by using a stainless metal plate as the sputtering target 22 and using argon as the reaction gas according to a known glow discharge sputtering method.

Figure 7:
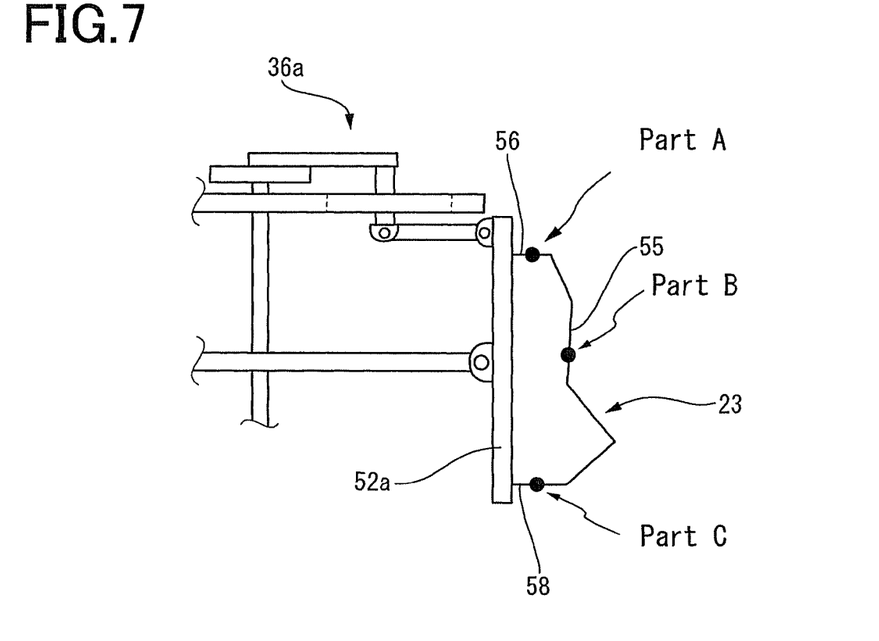
FIG. 7 is a view corresponding to FIG. 5, showing portions where a thickness of a coating film were measured in a comparative test in which the coating films were formed on surfaces of a substrate by the sputtering apparatus according to the present invention and a conventional sputtering apparatus and then the thickness of the coating film was measured.
Figure 8:
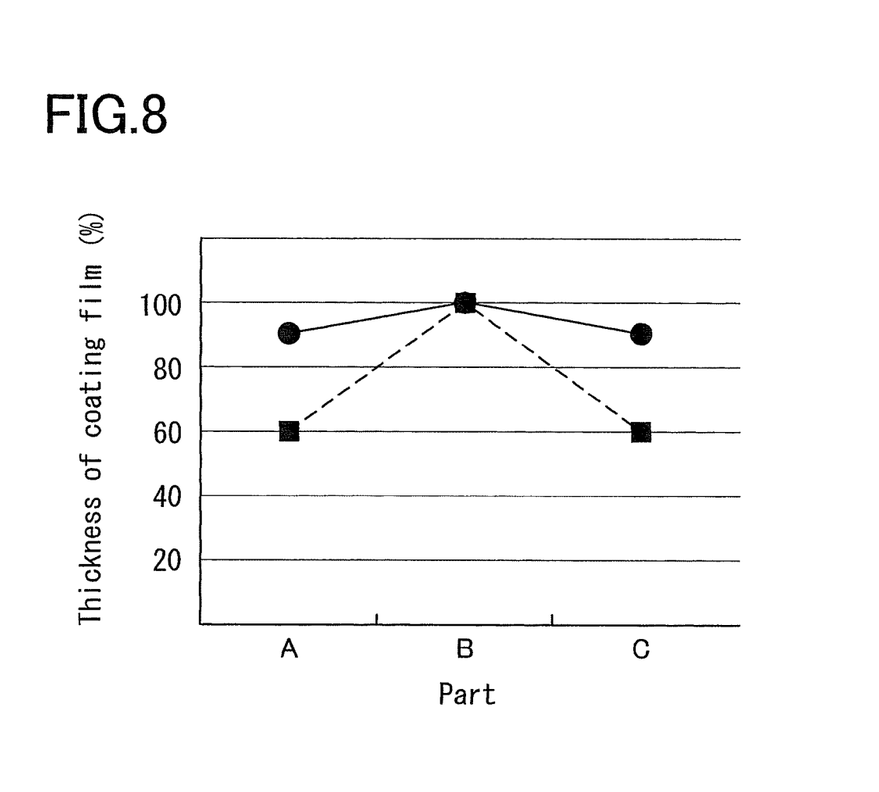
FIG. 8 is a graph showing results of the comparative test in which the coating films were formed on surfaces of the substrate by the sputtering apparatus according to the present invention and the conventional sputtering apparatus and then the thickness thereof was measured.

Thereafter, as shown in FIG. 7, the thickness of the coating film formed on the surfaces of the automobile interior part 23 supported by the upper supporting plate 52a was measured at a "portion A" on the upper side surface 56, a "portion B" on the design surface 55, and a "portion C" on the lower side surface 58 by a known method. Then, there was calculated a ratio of the thickness of the coating film formed at each of the "portion A" and the "portion C" when the thickness of the coating film formed at the "portion B" was set at 100%. FIG. 8 shows results, in which calculated values are indicated by black circles ●.

In addition, for comparison, a conventional sputtering apparatus having no structure for rotating the supporting plates of each supporting device was used to form a coating film on the surfaces of the automobile interior part by the same sputtering operation as above in a condition in which the automobile interior part supported by each supporting plate was fixedly supported by the supporting plate.

Then, the thickness of the coating film formed on the surfaces of the automobile interior part having the coating film formed as above was measured at each of the points corresponding to the "portion A", the "portion B", and the "portion C" shown in FIG. 7 by the known method to obtain three values. Then, comparison was made between the thickness of the coating film at the "portion B" of the surface of the automobile interior part, which was formed by rotating the automobile interior part around the second rotation axis along with the supporting plate to perform the sputtering operation as described above, and the three measured values. Specifically, each ratio of the three measured values was calculated when the thickness of the coating film at the "portion B" was set at 100%. FIG. 8 shows calculation results. In FIG. 8, three calculated values obtained as above are indicated by black squares ■.

As apparent from the results shown in FIG. 8, when the sputtering apparatus having the structure according to the present invention was used to perform the sputtering operation while reciprocatingly rotating the automobile interior part along with the supporting plate around the second rotation axis, the thickness of the coating film on the upper and lower side surfaces of the automobile interior part was approximately 90% with respect to the thickness of the coating film formed on the design surface, and a difference between the thickness of the former coating film and the thickness of the latter coating film was a sufficiently small value of approximately 10%. In contrast, when the sputtering operation is performed by the conventional sputtering apparatus, the thickness of the coating film on the upper and lower side surfaces of the automobile interior part is approximately 60% with respect to the thickness of the coating film on the design surface, and the difference between the former film thickness and the latter film thickness is an extremely large value of approximately 40%.

It is obviously recognized that the intended coating film is formed with the maximally even thickness on the entire surfaces of the automobile interior part where the coating film is to be formed by the sputtering apparatus having the structure according to the present invention regardless of a positional relationship between the automobile interior part and the sputtering target at the time of the sputtering operation.

While the preferred embodiment of the present invention has been described in detail, for illustrative purpose only, it is to be understood that the present invention is not limited to the details of the illustrated embodiment.

For example, in the above embodiment, the supporting plates 52a to 52d as supporting members are continuously and reciprocatingly rotated around the second rotation axis 50 a plurality of times during the time from beginning to end of formation of the coating film on the automobile interior part 23 as a substrate supported by the respective supporting plates 52a to 52d. The respective supporting members 52a to 52d may be reciprocatingly rotated around the second rotation axis 50 only one time, may be rotated around the second rotation axis 50 in a single direction, or may be reciprocatingly rotated 360 degrees around the second rotation axis 50 during the operation for forming the coating film on the automobile interior part 23.

When the respective supporting members 52a to 52d are rotated 360 degrees around the second rotation axis 50, any one of known various rotation mechanisms may be employed as a second driving mechanism instead of the exemplified rotation mechanism. Examples of the rotation mechanisms include a rotation mechanism comprising a rotation axis extended in the vertical direction as in the rotation mechanism axis 64, the second electric motor 70 rotating the rotation axis, the second driving gear 72, the second driven gear 68, and a gear mechanism (for example, a gear mechanism comprised of a combination of a worm and a worm wheel) that converts the rotation of the rotation axis extended in the vertical direction to the rotation around the second rotation axis 50, which is positioned to be orthogonal to the rotation axis, and that changes a direction of the rotation to obtain a rotation on a vertical surface so as to transmit the driving force of the rotation to the respective supporting plates 52a to 52d.

Additionally, when the respective supporting plates 52a to 52d are reciprocatingly rotated around the second rotation axis 50, the second driving mechanism can be formed by the above-described rotation mechanism by using a motor such as a stepping motor, for example, as the second electric motor 70, that is rotatable forwardly and reversely. In this case, since the rotation angle (a rotation amount) and the rotation rate of the second electric motor 70 can be controlled by the controller 37 as an adjustment mechanism, the rotation angle (the rotation amount) and the rotation rate of the respective supporting plates 52a to 52d can be adjusted to the desired amount in accordance with the size or the like of the automobile interior part 23 as the substrate where the coating film is to be formed. In this manner, regardless of the size or the like of the automobile interior part 23, the intended coating film can be surely formed with the maximally even and sufficient thickness and with the sufficiently strong adhesiveness on the entire surfaces of the automobile interior part 23 where the coating film is to be formed. Furthermore, the thickness of the coating film can be finely controlled by increasing or reducing the rotation angle and the rotation rate of the respective supporting members 52a to 52d.

The second driving mechanism that reciprocatingly rotates the respective supporting members 52a to 52d around the second rotation axis 50 may have a structure as below, instead of the exemplified structure including the crank mechanism that reciprocatingly slides the second link 90 reciprocatingly rotatably mounted to the respective supporting plates 52a to 52d. For example, there may be employed a structure including a gear mechanism that reciprocatingly slides the second link 90 by a combination of a pinion mounted integrally rotatably to the rotation mechanism axis 64 and a rack engaged with the pinion. Needless to say, any known structure may be employed as another alternative for the second driving mechanism.

In the above embodiment, the upper supporting plate 52a (52b) and the lower supporting plate 52c (52d) are reciprocatingly rotated by the single rotation mechanism, namely, the second driving mechanism. However, the upper supporting plate 52a (52b) and the lower supporting plate 52c (52d) may be reciprocatingly rotated by mutually independent and separate second driving mechanisms. Thereby, the rotation angle and the rotation rate of the upper supporting plate 52a (52b) and the lower supporting plate 52c (52d) can be mutually separately controlled for each supporting plate 52. As a result, even when the substrates (the automobile interior parts 23) having mutually different sizes are supported by the supporting plates 52, the coating film can be more advantageously and more efficiently formed on the surfaces of each of the substrates.

The second driving unit (the second electric motor 70) that reciprocatingly rotates the above supporting plates 52 and the first driving unit (the first electric motor 42) that rotates the first rotation axis 38 may comprise the single driving unit. Thereby, cost can be reduced due to the reduction of the number of component.

In the above embodiment, the four supporting devices 36a to 36d each include four supporting plates 52a to 52d, respectively. However, the number of the supporting devices 36 and the supporting plates 52 are not specifically limited to four.

When the single supporting device 36 includes the plurality of the supporting plates 52, the supporting plates 52 may be positioned adjacently and closely to each other in the extending direction of the second rotation axis 50 which extends in the direction orthogonal to the extending direction of the first rotation axis 38. It is also preferable in this case that the mutually adjacent supporting plates 52 are arranged so as to be rotated around the first rotation axis 38 in the mutually opposite directions. In this manner, when the sputtering operation is performed, it can be advantageously prevented that the self-shadowing effect inhibits the adhesion of the sputtered particles onto inner sides of the substrates which are defined by adjacent substrates each supported by the adjacent supporting plates in an arrangement direction of the supporting plates.

In the above embodiment, the supporting members are constituted by the supporting plates 52 comprised of the rectangular plates. However, the structure of each of the supporting members is not limited at all as long as the supporting members can support the substrates so as to allow the substrates to be opposed to the sputtering target. A structure for mounting the substrate on each of the supporting members is also not limited as long as the structure allows the substrate to be removed.

In addition, the above embodiment describes the specific example in which the invention is applied to the structure including the supporting devices and the sputtering apparatus used to form the coating film on the automobile interior part. However, it is obvious that the present invention can be advantageously applied to any supporting device and any sputtering apparatus used to form a coating film on various types of members other than automobile interior parts. Furthermore, as the sputtering method performed by using the device and the apparatus of the present invention, any known method such as glow discharge sputtering or ion beam sputtering may be employed.

Hereinabove, although the concrete structure of the invention has been described in detail, it is a mere exemplification. It is to be understood that the present invention may be embodied with various other changes and modifications which may occur to those skilled in the art, without departing from the spirit and scope of the invention.

What is claimed is:

1. A sputtering apparatus including a sputtering target made of a deposition material and at least one substrate that are disposed in a vacuum chamber so as to be opposed to each other with a predetermined distance therebetween, the apparatus being used for forming a coating film made of the deposition material constituting the sputtering target on the at least one substrate by sputtering, wherein a substrate supporting device is provided in the vacuum chamber to support the at least one substrate, and the substrate supporting device comprises:

at least one supporting member supporting the at least one substrate so as to be opposed to the sputtering target, the at least one supporting member being disposed in the vacuum chamber in a rotatable manner around a first rotation axis and a second rotation axis, the first rotation axis extending in a first direction orthogonal to a direction in which the at least one substrate and the sputtering target are opposed to each other and the second rotation axis extending in a second direction orthogonal to both of the first direction and the direction in which the at least one substrate and the sputtering target are opposed to each other, the at least one supporting member being each provided with the second rotation axis, a first driving mechanism including a first driving unit generating a predetermined rotation driving force to rotationally drive the at least one supporting member around the first rotation axis; and a second driving mechanism including a second driving unit generating a predetermined rotation driving force to rotationally drive the at least one supporting member around the second rotation axis, wherein the first rotation axis and the second rotation axis are connected via a retaining bar that extends from the first rotation axis in a horizontal direction orthogonal to an extending direction of the first rotation axis and being provided with the second rotation axis at an extended tip portion of the retaining bar.

2. The sputtering apparatus according to claim 1, wherein the at least one supporting member comprises a plurality of supporting members, the plurality of supporting members being disposed adjacently and closely to each other in the first direction in the vacuum chamber and being opposed to the sputtering target, and wherein the plurality of supporting members adjacent to each other are rotated in mutually opposite directions around the second rotation axis by the second driving mechanism.

3. The sputtering apparatus according to claim 1, wherein the at least one supporting member comprises a plurality of supporting members, the plurality of supporting members being disposed adjacently and closely to each other in the second direction in the vacuum chamber and being opposed to the sputtering target, and wherein the plurality of supporting members adjacent to each other are rotated in mutually opposite directions around the first rotation axis by the first driving mechanism.

4. The sputtering apparatus according to claim 1, wherein the at least one supporting member is disposed in a rotatable manner around at least one of the first rotation axis and the second rotation axis in the vacuum chamber, and wherein the at least one supporting member is rotated continuously a plurality of times by at least one of the first driving mechanism and the second driving mechanism during the formation of the coating film on at least one surface of the at least one substrate supported by the at least one supporting member.

5. The sputtering apparatus according to claim 1, wherein the at least one supporting member is disposed in a rotatable manner around at least one of the first rotation axis and the second rotation axis in the vacuum chamber so as to be rotated by at least one of the first driving mechanism and the second driving mechanism, and wherein the substrate supporting device further comprises an adjustment mechanism to increase or reduce a rotation amount of the at least one supporting member to any desired amount.

6. The sputtering apparatus according to claim 1, wherein the at least one supporting member comprises a plurality of supporting members, the plurality of supporting members being disposed in a displaceable manner in the vacuum chamber, and wherein the substrate supporting device further comprises a position changing unit, the position changing unit being provided for changing positions of the plurality of supporting members such that each of the plurality of supporting members is located in turn at a position opposed to the sputtering target.

7. The sputtering apparatus according to claim 6, wherein the plurality of supporting members are disposed in a rotatable manner around a third rotation axis such that each of the plurality of supporting members is located in turn at the position opposed to the sputtering target in a horizontal direction along with the rotation, the third rotation axis extending in a vertical direction, and wherein the position changing unit comprises a third driving mechanism including a third driving unit generating a predetermined rotation driving force to rotationally drive the plurality of supporting members around the third rotation axis, and a controlling mechanism for controlling the rotational driving of the third driving unit such that the rotational driving of the third driving unit is suspended every time each of the plurality of supporting members is located in turn at the position opposed to the sputtering target along with the rotation of the plurality of supporting members.

8. The sputtering apparatus according to claim 1, wherein the first driving unit and the second driving unit comprise the same driving unit.

* * * * *